(12) United States Patent
Hsu et al.

(10) Patent No.: US 6,631,503 B2
(45) Date of Patent: Oct. 7, 2003

(54) TEMPERATURE PROGRAMMABLE TIMING DELAY SYSTEM

(75) Inventors: Louis L. Hsu, Fishkill, NY (US); Rajiv V. Joshi, Yorktown Heights, NY (US); John A. Fifield, Underhill, VT (US)

(73) Assignee: IBM Corporation, Armonk, NY (US)

( * ) Notice: Subject to any disclaimer, the term of this patent is extended or adjusted under 35 U.S.C. 154(b) by 172 days.

(21) Appl. No.: 09/755,860

(22) Filed: Jan. 5, 2001

(65) Prior Publication Data

US 2002/0133789 A1 Sep. 19, 2002

(51) Int. Cl.⁷ .............................................. G06F 17/50
(52) U.S. Cl. .................................. 716/4; 716/5; 716/6
(58) Field of Search ........................ 716/4–6; 702/130, 702/132; 374/170, 178; 363/41; 327/276, 336, 539, 543; 324/760; 713/320, 322

(56) References Cited

U.S. PATENT DOCUMENTS

| | | | | |
|---|---|---|---|---|
| 5,838,578 A | * | 11/1998 | Pippin ............................ | 716/4 |
| 6,055,489 A | * | 4/2000 | Beatty et al. ................ | 702/130 |
| 6,101,106 A | * | 8/2000 | Shi .............................. | 363/41 |

* cited by examiner

Primary Examiner—Vuthe Siek
Assistant Examiner—Naum Levin
(74) Attorney, Agent, or Firm—Dilworth & Barrese, LLP (57) ABSTRACT

The present invention provides a temperature programmable timing delay system utilizing circuitry for generating a band-gap reference and for sensing the on-chip temperature of an integrated circuit chip. The circuitry outputs the sensed temperature as a binary output which is received by a programmable table circuit of the timing delay system. The programmable table circuit outputs a binary output corresponding to the received binary output. The timing delay system further includes a temperature dependent timing delay circuit having inputs for receiving the binary output of the programmable table circuit and an output for outputting a timing delay signal for delaying a clock by a timing delay corresponding to the binary output of the programmable table circuit. The band-gap reference can be a temperature independent band-gap reference voltage having a constant-voltage value or a temperature dependent band-gap reference current having a constant-current value. A method is also provided for varying a characteristic of a timing delay signal in accordance with variations of the on-chip temperature of an integrated circuit chip. The method includes the steps of generating a reference parameter; sensing the on-chip temperature of the integrated circuit chip by utilizing at least the reference parameter; providing the sensed on-chip temperature as a binary reading; using the binary reading for providing a respective binary code indicating a timing delay; and varying the characteristic of the timing delay signal, such as the signal's rise time, in accordance with the binary code.

26 Claims, 8 Drawing Sheets

TEMPERATURE PROGRAMMABLE TIMING DELAY SYSTEM

FIELD OF THE INVENTION

This invention relates to the field of integrated circuit (IC) design. Specifically, it relates to a temperature programmable timing delay system whose timing delay or clock frequency is temperature dependent.

BACKGROUND OF THE INVENTION

The effects of temperature on integrated circuits and systems can significantly affect the operational characteristics of such circuits and systems. The primary reason is that solid state devices behave differently at different temperatures. For example, when the on-chip temperature increases or decreases from room temperature, the electrical characteristics of the chip's solid state devices change significantly, such as threshold voltage, wiring/contact resistance, electron mobility, etc., as compared to the same characteristics at room temperature. Accordingly, it is well known that a circuit designed to operate at optimum at a specific temperature range will generally not operate effectively or desirably at different temperature ranges, especially, at very high and very low temperature ranges.

For example, when the on-chip temperature of a central processing unit (CPU) increases, especially, when the CPU is operating in its active mode, the temperature independent timing delay or clock frequency of the CPU's clock circuit may deem the CPU undesirable to operate. This is because, the high on-chip temperature causes the timing delay of the clock circuit to increase, since the clock circuit is operated at a constant frequency which is independent of temperature. As a consequence, the processing speed of the CPU is noticeably affected. However, when the on-chip temperature decreases, or when the CPU is in its low-power mode, the constant frequency of the clock circuit may be unnecessarily too fast, thereby resulting in high power consumption.

To adjust for the increase in the timing delay when the on-chip temperature increases, it is desirable to operate the clock circuit at a higher frequency. And to prevent high power consumption when the on-chip temperature decreases, it is desirable to operate the clock circuit at a lower frequency. Accordingly, there is a need for timing delay system, or clock generator, whose frequency can be automatically adjusted as the on-chip temperature changes.

SUMMARY

It is an objective of the present invention to provide a temperature programmable timing delay system whose timing delay or clock frequency is temperature dependent.

It is another objective of the present invention to provide a timing delay system whose timing delay is temperature independent, but the timing delay is capable of being adjusted according to the on-chip temperature via an on-chip digital temperature sensor.

Another objective of the present invention is to provide a timing delay system whose timing delay can be automatically adjusted by the on-chip temperature using a predetermined function or look-up table correlating the on-chip temperature with a respective timing delay.

Yet, another objective of the present invention is to provide a timing delay system having a built-in-self-test capability for setting the adjustment range of the system by the on-chip temperature.

Finally, another objective of the present invention is to provide a timing delay system which allows users to program the delay-temperature relationship of the system.

In particular, the present invention provides a temperature programmable timing delay system utilizing circuitry for generating a band-gap reference and for sensing the on-chip temperature of an integrated circuit chip. The circuitry outputs the sensed temperature as a binary output which is received by a programmable table circuit of the timing delay system. The programmable table circuit outputs a binary output corresponding to the received binary output. The timing delay system further includes a temperature dependent timing delay circuit having inputs for receiving the binary output of the programmable table circuit and an output for outputting a timing delay signal for delaying a clock by a timing delay corresponding to the binary output of the programmable table circuit. The band-gap reference can be a temperature independent band-gap reference voltage having a constant-voltage value or a temperature dependent band-gap reference current having a constant-current value.

The present invention also provides a method for varying a characteristic of a timing delay signal in accordance with variations of the on-chip temperature of an integrated circuit chip. The method includes the steps of generating a reference parameter; sensing the on-chip temperature of the integrated circuit chip by utilizing at least the reference parameter; providing the sensed on-chip temperature as a binary reading; using the binary reading for providing a respective binary code indicating a timing delay; and varying the characteristic of the timing delay signal, such as the signal's rise time, in accordance with the binary code.

DETAILED DESCRIPTION OF THE INVENTION

Figure 1:
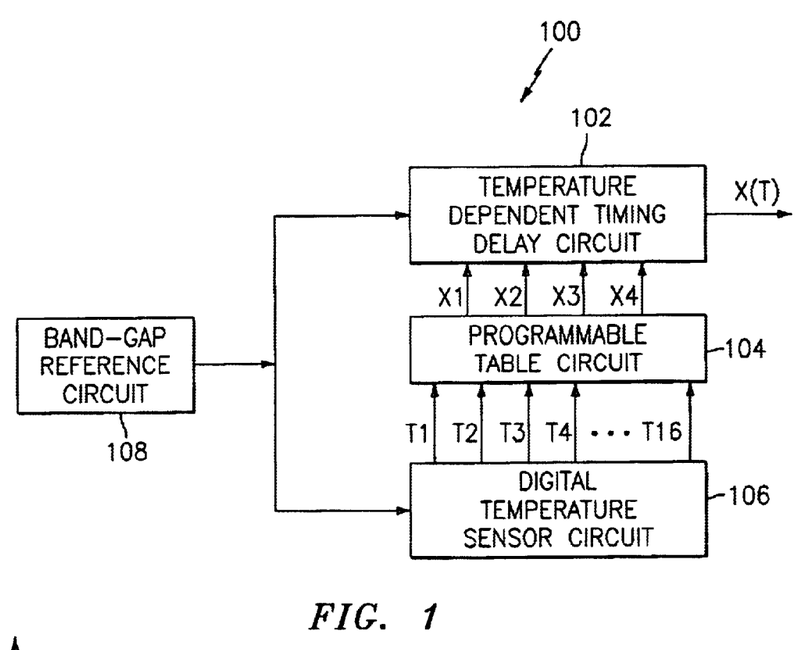
FIG. 1 is a block diagram of a temperature programmable timing delay system including a temperature dependent timing delay circuit according to the present invention.

The present invention provides a temperature dependent timing delay circuit which operates at low-voltage and therefore consumes low-power. With reference to FIG. 1, the temperature dependent timing delay circuit is shown and designated generally by reference numeral 102. The timing delay circuit 102 is operational itself and by being connected to a programmable table circuit 104, a digital temperature sensor circuit 106 and a low-voltage, low-power band-gap reference circuit 108 to form a temperature programmable timing delay system designated generally by reference numeral 100.

The timing delay system 100 provides a band-gap reference, senses the on-chip temperature of a semiconductor chip, such as an eDRAM memory unit, using the band-gap reference, and adjusts the timing delay of a clock circuit. It is contemplated that if a band-gap reference circuit is already provided on a semiconductor chip, the band-gap reference circuit 108 of the temperature programmable timing delay system 100 can be omitted and the system 100 can be connected to the band-gap reference circuit of the semiconductor chip to decrease implementation costs.

The band-gap reference circuit 108 provides a temperature independent voltage or current reference to the timing delay circuit 102 and the digital temperature sensor 106. The timing delay X(T) of the timing delay circuit 102 is originally made to be insensitive to temperature, but capable of being altered by inputs Xi received from the programmable table circuit 104 during operation of the timing delay system 100. The programmable table circuit 104 stores the function (or relationship) of delay versus temperature using technologies known in the art, such as mask programmable read-only-memory, flash memory, a look-up table, read-only-memory (ROM), field programmable gate array (FPGA), EEPROM, programmable e-fuse, etc. The digital temperature sensor circuit 106 can be any temperature sensor circuit known in the art and one preferably having at least 16 temperature outputs., i.e., T1–T16. The outputs Ti are input to the programmable table circuit 104 for determining the logic level of outputs Xi.

I. Programmable Table Circuit

In one embodiment, 16-bit temperature readings are received by the programmable table circuit 104 from the digital temperature sensor circuit 106. Each 16-bit reading represents a 10-degree Celsius temperature range within an overall Celsius temperature range of −30 to 120 degrees. Therefore, one bit represents a 10-degree Celsius range. The temperature inputs Ti are translated into four outputs Xi (i=1 to 4) which in turn adjust the timing of the temperature dependent timing delay circuit 102 through a binary weighted pattern, which is described below.

Figure 2A:
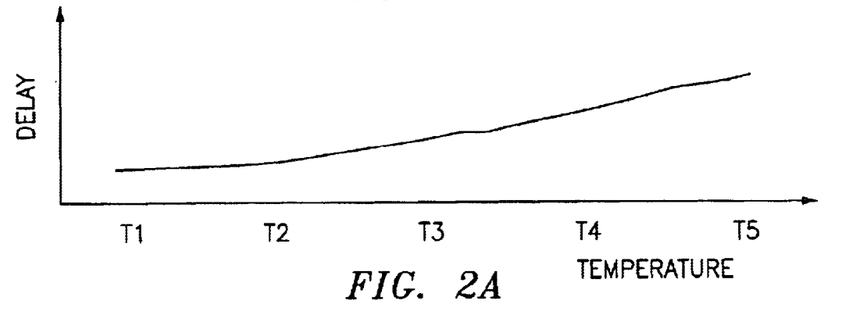
FIGS. 2A and 2B illustrate charts plotting delay versus temperature relationships capable of being implemented by the temperature programmable timing delay system according to the present invention.
Figure 2B:
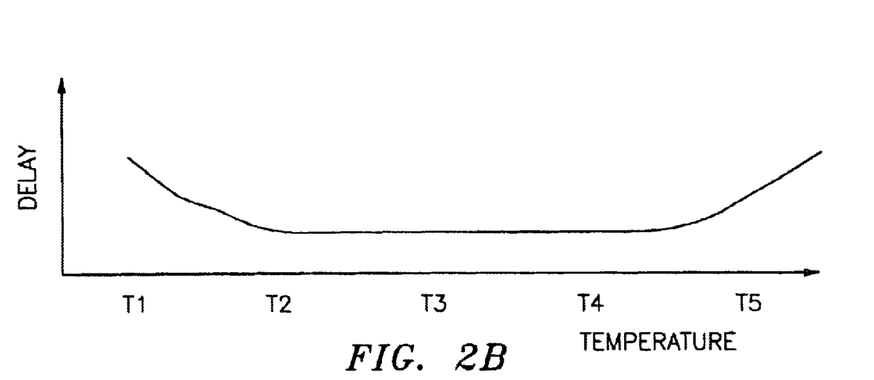

An example of a progressively timing delay increase function capable of being programmed within the programmable table circuit 104 is shown by Table 1. It is envisioned, however, that one can program the programmable table circuit 104 for any delay versus temperature relationships. Two such relationships are indicated by the charts of FIGS. 2A and 2B. These charts illustrate two examples of delay versus temperature relationships that can be implemented in applications which require a timing delay adjustment of a clock circuit due to on-chip temperature fluctuations.

TABLE 1

Timing delay increase function programmed within the programmable table circuit.

| On-chip Temp. Range (Celcius) | Digital Temp. Sensor Circuit Output | Prog. Table Circuit Output X1 | Prog. Table Circuit Output X2 | Prog. Table Circuit Output X3 | Prog. Table Circuit Output X4 | Timing Delay (ns) |
|---|---|---|---|---|---|---|
| −30 to −21 | T1 = 1 | 0 | 0 | 0 | 0 | 1 |
| −20 to −11 | T2 = 1 | 1 | 0 | 0 | 0 | 2 |
| −10 to −1 | T3 = 1 | 0 | 1 | 0 | 0 | 3 |
| 0 to 9 | T4 = 1 | 1 | 1 | 0 | 0 | 4 |
| 10 to 19 | T5 = 1 | 0 | 0 | 1 | 0 | 5 |
| 20 to 29 | T6 = 1 | 1 | 0 | 1 | 0 | 6 |
| 30 to 39 | T7 = 1 | 0 | 1 | 1 | 0 | 7 |
| 40 to 49 | T8 = 1 | 1 | 1 | 1 | 0 | 8 |
| 50 to 59 | T9 = 1 | 0 | 0 | 0 | 1 | 9 |
| 60 to 69 | T10 = 1 | 1 | 0 | 0 | 1 | 10 |
| 70 to 79 | T11 = 1 | 0 | 1 | 0 | 1 | 11 |
| 80 to 89 | T12 = 1 | 1 | 1 | 0 | 1 | 12 |
| 90 to 99 | T13 = 1 | 0 | 0 | 1 | 1 | 13 |
| 100 to 109 | T14 = 1 | 1 | 0 | 1 | 1 | 14 |
| 110 to 119 | T15 = 1 | 0 | 1 | 1 | 1 | 15 |
| 120 to 129 | T16 = 1 | 1 | 1 | 1 | 1 | 16 |

As evident from Table 1, the primary purpose of the programmable table circuit 104 is to relate a specific temperature reading, as read by the digital temperature sensor circuit 106, into a specific timing delay.

II. Temperature Dependent Timing Delay Circuit

Figure 3:
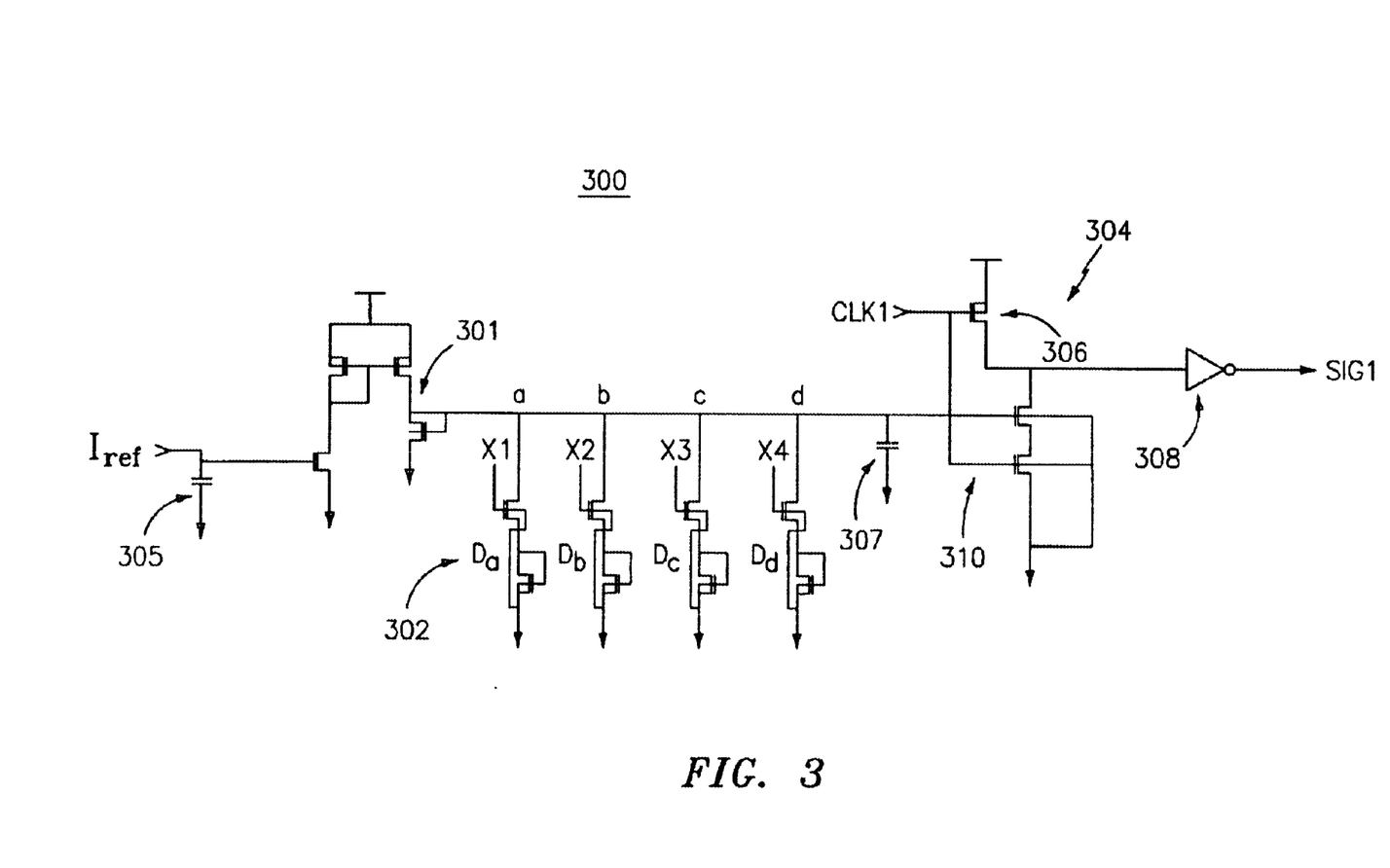
FIG. 3 is a schematic diagram of a temperature independent timing adjustable circuit configured for being incorporated within the timing delay system of FIG. 1.

The specific timing delay is conveyed to the temperature dependent timing delay circuit 102 by the programmable table circuit 104 as a four-bit output. The temperature dependent timing delay circuit 102 is similar to the temperature independent timing adjustable circuit as shown by FIG. 3 and designated generally by reference numeral 300. This circuit is described in U.S. patent application Ser. No. 09/501,216 filed on Feb. 10, 2000 by Fifield et al. and having a common assignee as the present application. The contents of U.S. patent application Ser. No. 09/501,216 are incorporated herein by reference. In the temperature independent timing adjustable circuit 300 the timing delay is adjustable by a binary input.

The timing circuit 300 receives from the band-gap reference circuit 108 (see FIGS. 4A and 5) a temperature independent reference current level, Iref, to be used by a current mirror 301. The reference current level, Iref, is amplified from its initial level of approximately 1.5 ua to 3 ua in a second leg of a current-mirror amplifier 302. This second leg has four inputs for receiving binary inputs X1–X4 from the programmable table circuit 104 and also has four reference diodes Da–Dd with device-beta scaled with binary weighting. That is, the width of the diode of the "a" branch, i.e., diode Da, has W=2; the width of the diode of the "b" branch, i.e., diode Db, has W=4; the width of the diode of the "c" branch, i.e., diode Dc, has W=8; and the width of the diode of the "d" branch, i.e., diode Dd, has W=16. The branches "a–d" are selected to modulate the propagation delay of the programmable delay line. Two capacitors 305 and 307 are used to stabilize the timing circuit 300.

The remaining circuitry 304 shows an input clock CLK1 whose rising edge is to be delayed. While clock CLK1 is low (0 volts), a pull-up pMOS device 306 will first drive an output-buffer 308 to low. When clock CLK1 is switched high, the pull-up pMOS device 306 is cut-off, and a current is gated through current source via an nMOS switch 310.

With the discharge current predicted by the ratio of Beta nMOSs/Beta reference as known in the art, the rate of voltage discharge, and hence the delay of the rising edge of clock signal SIG1, equivalent to signal X(T) in FIG. 1, is highly predictable. The relationship of CV/I=T, where C stands for capacitance, V stands for voltage (i.e., CV=q or charge), I stand for current, and T stands for delay (or time), is used to predict the propagation delay or timing delay to the selection of the binary-weighted reference diodes Da–Dd of the current-mirror amplifier 302 due to the logic level of inputs X1–X4 from the programmable table circuit 104. It is contemplated that the circuit 300 may be designed such that the delay of the falling edge of clock signal SIG1 is delayed, rather than the rising edge of the clock signal SIG1.

III. Band-gap Reference Circuit

Preferably, the band-gap reference circuit 108 of the timing delay system 100 of the present invention includes a band-gap reference circuit which consumes much less power, especially during the sleep or low-power mode, as compared to prior art band-gap reference circuits, by incorporating high-resistance (high-R) resistors. These high-R resistors are implemented using a thin-film material, such as TaSiN capable of having a sheet resistance up to one M-ohm. The band-gap reference circuit 108 used by the timing delay system 100 is preferably the band-gap reference circuit described in U.S. patent application Ser. No. 09/611,519 filed on Jul. 7, 2000 by Hsu et al. and having a common assignee as the present application. The contents of U.S. patent application Ser. No. 09/611,519 are incorporated herein by reference.

Figure 4A:
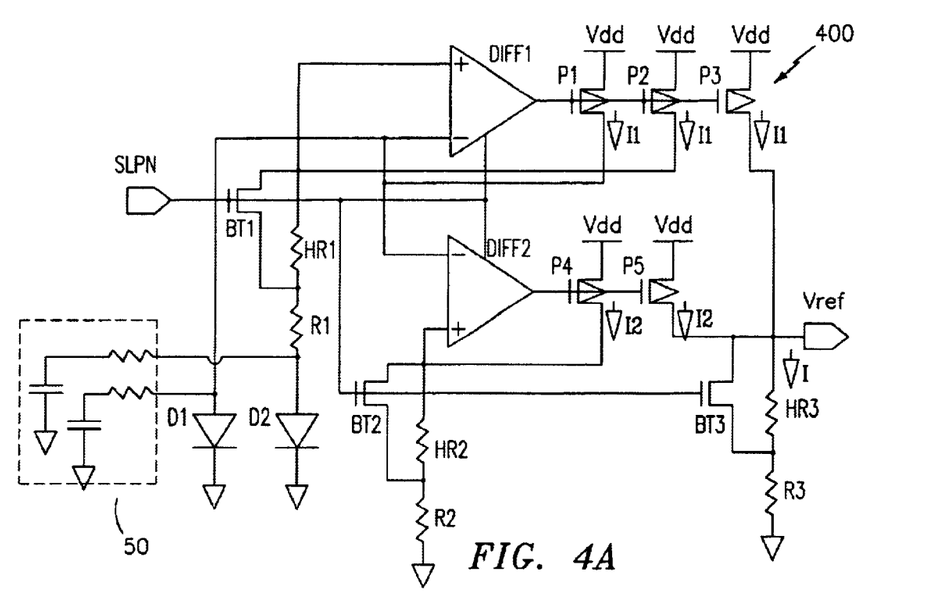
FIG. 4A is a schematic diagram of a low-voltage, low-power band-gap reference generator configured for being incorporated within the timing delay system of FIG. 1.

A preferred embodiment of a low-voltage, low-power band-gap reference circuit is schematically shown by FIG. 4A and designated generally by reference numeral 400. A sleep control (SLPN) signal is used to achieve low-power operations. On each DC path there is a high-R resistor HR1, HR2, HR3, preferably implemented with a thin-film material, having a greater resistance than a respective corresponding series resistor R1, R2, R3.

Preferably, each high-R resistor HR1, HR2, HR3 has nine times more resistance than its corresponding resistor R1, R2, R3, in order to reduce the DC current flow by ten times, when the band-gap reference circuit 400 is operated during low-power operations. During high-power and high-speed operations, the DC current flow on each DC path is increased by deactivating the SLPN signal and the high-R resistors HR1, HR2, HR3 are by-passed and the band-gap reference circuit 400 only includes resistors R1, R2, R3.

Each high-R resistor HR1, HR2, HR3 is in series with its corresponding resistor R1, R2, R3. That is, high-R resistor HR1 is in series with resistor R1, high-R resistor HR2 is in series with resistor R2, and high-R resistor HR3 is in series with resistor R3

The band-gap reference circuit 400 further includes two differential amplifiers Diff1, Diff2, five pMOS transistors P1, P2, P3, P4, P5, three by-pass nMOS transistors BT1, BT2, BT3, and two diodes D1, D2 having different cross-sectional areas. Preferably, the cross-sectional area of diode D2 is approximately sixteen times larger than the cross-sectional area of diode D1.

Figure 4B:
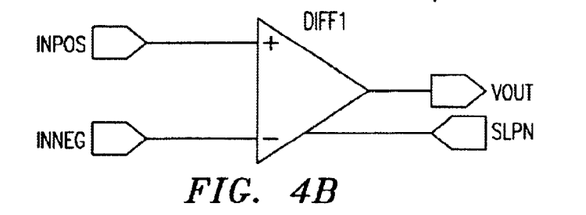
FIG. 4B is a diagram of a differential amplifier of FIG. 4A.

Transistors P1, P2, P3 and P4, P5 are commonly connected via their gates to the output of differential amplifiers Diff1, Diff2, respectively, and with each other to forego any input offset due to mismatches and to equally divide the current output from differential amplifiers Diff1, Diff2, respectively. FIG. 4B illustrates differential amplifier Diff1 with its corresponding output Vout and corresponding inputs: positive input INPOS, negative input INNEG and sleep control signal SLPN, i.e., non-in-sleep mode input.

Figure 4C:
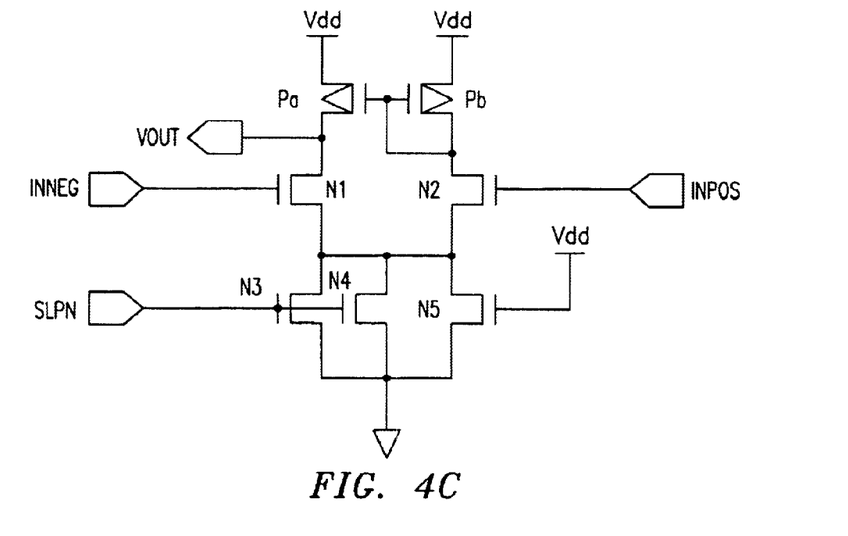
FIG. 4C is a schematic diagram of the differential amplifier of FIG. 4A.

FIG. 4C is a schematic illustration of differential amplifier Diff1. Differential amplifier Diff1 includes two pull up pMOS transistors Pa, Pb, two pull-down nMOS transistors N1, N2, and three current source transistors N3, N4, N5. The positive input INPOS is fed into the gate of transistor N2, and the negative input INNEG is fed into the gate of transistor N1, and the not-in-sleep mode input SLPN is tied to the gates of transistors N3, N4, while the gate of transistor N5 is always tied to the supply voltage, Vdd. When the chip is not in the sleep mode, or in the active mode, a fast response of the differential amplifier Diff1 is expected. At this moment, SLPN=1, the current source is formed by three switched-on nMOS transistors N3, N4, N5. On the other hand, when the chip enters the sleep mode, or SLPN=0, two of the three nMOS current source transistors are shut off, and the DC current of the differential amplifier Diff1 is significantly reduced.

Transistor P2 is connected in series with resistor R1 and diode D2 and transistor P1 is connected in series with diode D1. Transistors P1, P2, P3 have an identical width for equally dividing the current output from differential amplifier Diff1. The source side of transistors P1, P2, P3 is connected to the supply voltage, Vdd. The drain side of transistors P1, P2, P3 is connected to diode D1, resistor R1 and output reference voltage, Vref, respectively.

Therefore, the current flow I1, i.e., the current flow from the supply voltage, Vdd, through each transistor P1, P2, P3, can be determined by:

$$I1=(V_{be1}-V_{be2})/R1,$$

where $V_{be1}$ and $V_{be2}$ are the base-emitter voltage across the first and second diodes D1, D2, respectively.

Additionally, transistors P4, P5 have an identical width for equally dividing the current output from the differential amplifier Diff2. Accordingly, since $I1=\ln16(V_O/R1)$, where $V_O=kT/q$ and sixteen is the diode area ratio between D2 and D1, then the current flow I2, i.e., the current flow from supply voltage, Vdd, through each transistor P4, P5, can be determined by:

$$I2=V_{be1}/R2.$$

The source side of transistors P4, P5 is connected to the supply voltage, Vdd; the drain side of transistor P4 to resistor R2 and the drain side of transistor P5 to the reference voltage, Vref.

Thus, one of the functions of transistors P1, P2, P3 and P4, P5 is to divide the current sources I1 and I2 among three and two different paths, respectively.

In the preferred band-gap reference circuit 400, $V_{be1}$ has a negative temperature coefficient of about −2 mV per degree Celsius, and $V_O\ln16$ has a positive temperature coefficient of 0.24 mV per degree Celsius. Bot I1 and I2 are fed to resistor R3 to create a temperature independent reference voltage, Vref. In order to completely cancel out the temperature effect, the R2/R1 ratio must equal to $V_{be1}/(V_O\ln16)$, or approximately 8.33. The final current I is the sum of I1 and I2, where I1 has a positive temperature coefficient and I2 has a negative temperature coefficient. Hence, I1 and I2 compensate each other and $$I=1/R2[(R2/R1)(\ln16)V_o+V_{be1}].$$

In a preferred design embodiment for the band-gap reference circuit 400 of the present invention, in order to obtain a band-gap reference voltage, Vref, of 0.5 volt with a supply voltage, Vdd, of 1.0 volt, R1, R2 and R3 are chosen to have resistance of 10 k-ohms, 83.3 k-ohms and 34.7 k-ohms, respectively. This is because the band-gap reference voltage, Vref, is calculated as follows:

$$Vref=(I1+I2)R3=(R3/R2)[(R2/R1)(V_0\ln 16)+V_{be1}].$$

In further detail and with continued reference to FIG. 1, one of the bypass transistors BT1, BT2, BT3 is added to each of the high-R resistors HR1, HR2, HR3. In the normal mode or high-power, high-speed operations, the high-R resistors HR1, HR2, HR3 are by-passed and the band-gap reference circuit 400 only sees resistors R1, R2, R3. In sleep or low-power operations, the DC current at each differential amplifier Diff1, Diff2 is also reduced.

It is contemplated, in order to reduce the power consumed by the differential amplifiers Diff1, Diff2, to reduce the size of the current sources by a predetermined number of times during low-power operations. As a result, the power savings during low-power operations, i.e., during the sleep or low-power mode, will be increased. It is also contemplated to add a RC filter to the band-gap reference circuit 400 to limit the switching speed of the diodes D1, D2, in order to avoid switching noise from being coupled to the band-gap reference voltage, Vref, as shown by the dotted box designated by reference numeral 50 in FIG. 4A.

Figure 5:
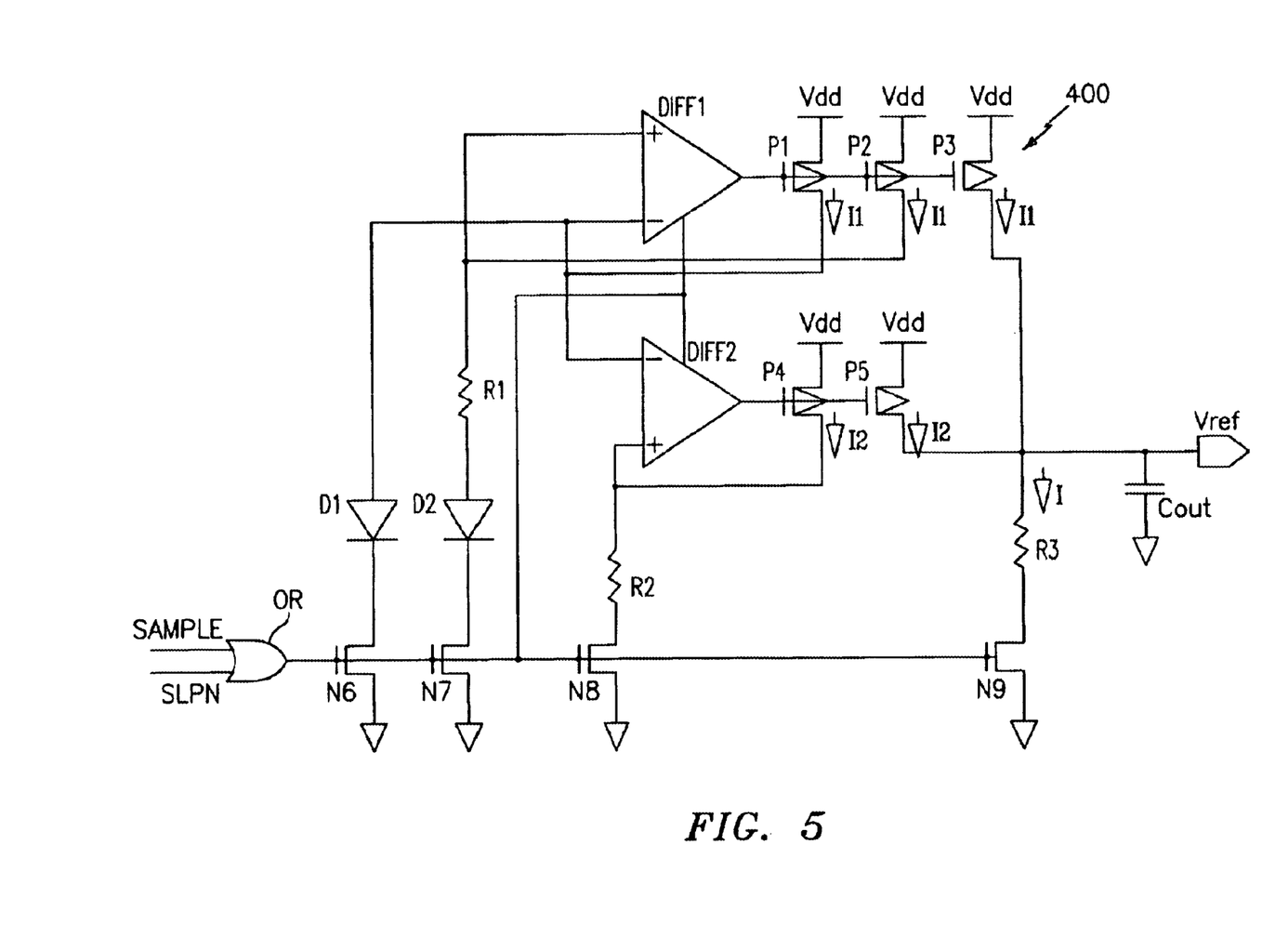
FIG. 5 is a schematic diagram of a low-voltage, low-power band-gap reference circuit having a sampling mode configured for being incorporated within the timing delay system of FIG. 1.

With reference to FIG. 5, a sample mode is added to the band-gap reference circuit 400. The sample mode allows the sampling of the band-gap reference voltage, Vref, during low-power operations. That is, one can OR the sleep control (SLPN) signal and sample (or refresh) signals to sample the band-gap reference voltage, Vref, during low-power operations. This feature lets the band-gap reference voltage, Vref, float at a low voltage level during low-power operations or a low-power period, and the sample or refresh signal restores (or resets) the band-gap reference voltage, Vref, up to the target voltage level before the refresh operation or high-power operations. The refresh operation will then refresh the cells of the memory unit, such as the eDRAM. When the refresh operation has been completed, the refresh signal is terminated and the band-gap reference voltage, Vref, returns to the low voltage mode.

In greater detail, with continued reference to FIG. 5, the SLPN and SAMPLE signals are fed into the OR gate. The output of the OR gate controls the switch of all the DC paths. In the embodiment shown by FIG. 5, there are four DC paths; each one is connected to an nMOS transistor N6, N7, N8, N9. In normal operations or when SLPN=1, the band-gap reference circuit 400 operates in a DC mode, i.e., not in the sample mode. At this moment, all the switches are turned on, DC current flows through each path, and a constant reference voltage, Vref, is established.

In the sleep mode or when SLPN=0, the switches are not turned on until SAMPLE=1. When SAMPLE=1, the reference voltage, Vref, is established and the level of the reference voltage, Vref, is held by an output capacitor Cout. When the SAMPLE=0, the reference voltage, Vref, is left floating and its level is drifted lower gradually depending on the leakage condition. It is desirable to sample the reference voltage, Vref, before it drifts below a predetermined level, for example, to refresh a DRAM array. It is contemplated to use low-resistance resistors for a better response time, since the sampling period is relatively short.

As discussed above, with respect to the low-voltage, low-power band-gap reference circuit 400, a temperature dependent voltage can be generated, i.e., via a positive temperature coefficient component or a negative temperature coefficient component. In addition, one can also generate the temperature independent reference current level, Iref, to be used by the current mirror 301 of the temperature dependent timing delay circuit 102 by combining the positive temperature coefficient component and the negative temperature coefficient component.

More specifically, the band-gap reference circuit 400 can output a first current I1 (or first voltage, by multiplying the output current with a resistor ratio) with a positive temperature coefficient and a second current I2 (or second voltage) with a negative temperature coefficient. Further, the band-gap reference circuit 400 can create a third voltage, i.e., band-gap reference voltage, Vref, (or third current, by dividing the third voltage with a resistor ratio), which is independent of the temperature, from the sum of the first and second currents. The band-gap reference voltage, Vref, is used by the temperature dependent timing delay circuit 102, as noted above, and the digital temperature sensor circuit 106 as described below.

IV. Digital Temperature Sensor Circuit

Two embodiments will now be described with reference to the digital temperature sensor circuit 106 of the timing delay system 100. Both embodiments obtain a band-gap reference voltage or current from a band-gap reference circuit (similar to the band-gap reference circuit 400) and output a four-bit binary output indicating the on-chip temperature. It is contemplated that both embodiments of the digital temperature sensor circuit can be modified by one skilled in the art to output a 16-bit binary output which serves as the input for the 16-bit programmable table circuit 104. Both embodiments of the digital temperature sensor circuit 106 are described in U.S. patent application Ser. No. 09/611,519.

A. A First Embodiment

A low-voltage, low-power band-gap reference and temperature sensor circuit can be realized by applying a temperature independent voltage Vref from the band-gap reference circuit 400 as shown by FIGS. 4A and 5 to the digital temperature sensor circuit 106 as described below. For example, a temperature independent voltage reference Vref from the band-gap reference circuit of FIG. 4A can be applied to an input of a differential amplifier and a temperature dependent reference voltage Vi, where i=1, 2, 3 or 4, obtained from a positive temperature dependent branch or from a negative temperature dependent branch, can be fed to the negative input of the same differential amplifier. When the temperature independent voltage curve intersects with the temperature dependent voltage curve, a predetermined temperature index is read.

Figure 6:
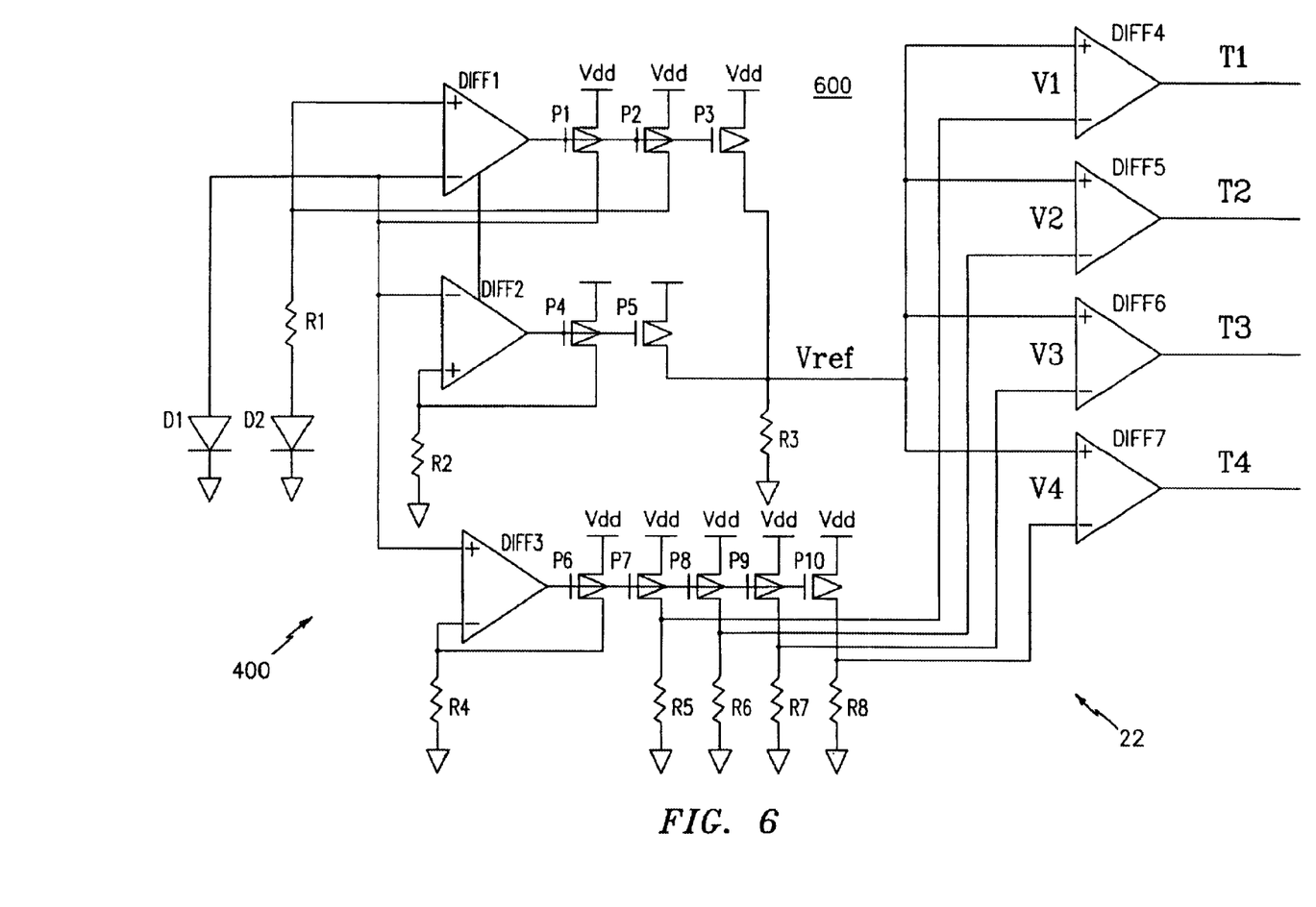
FIG. 6 is a schematic diagram of a first embodiment of a combined low-voltage, low-power band-gap reference and temperature sensor circuit according to the present invention.

A first embodiment of a band-gap reference and temperature sensor circuit is shown by FIG. 6 and designated generally by reference numeral 600. Sensor circuit 600 includes the band-gap reference circuit 400 described above and a temperature sensing circuit 22. It is noted that the by-pass transistors BT1, BT2, BT3 the high-R resistors HR1, HR2, HR3 and the SLPN signal are not shown by FIG. 6 for simplicity. FIG. 6 is illustrated as operating during normal power operations when these elements are by-passed by a low SLPN signal.

The band-gap reference circuit 400 generates a negative temperature coefficient voltage. The negative temperature coefficient voltage is from the $V_{be1}$ component that is fed to the negative ports of the two differential amplifiers Diff1, Diff2.

A third differential amplifier Diff3 is used to produce the temperature dependent voltages to complete the temperature sensor circuit 22. Accordingly, the voltage lines or group of negative temperature coefficient lines V1, V2, V3, V4 are the product of $V_{be1}$ and Ri/R4, where Ri refers to one of the following resistors: R5, R6, R7, R8. For example, V1=$V_{be1}$ (R5/R4), where Ri=R5.

Resistors R5, R6, R7, R8 are in series with a corresponding transistor P7, P8, P9, P10. These transistors are commonly connected via their gates with each other and with transistor P6 to forego any input offset due to mismatches and to equally divide the current output from differential amplifier Diff3. Additionally, these transistors P6, P7, P8, P9, P10 have an identical width to equally divide the current output from differential amplifier Diff3.

Each resistor R5, R6, R7, R8 is connected to a corresponding differential amplifier Diff4, Diff5, Diff6, Diff7 for outputting temperature dependent voltages T1, T2, T3, T4 which correspond to a point on the group of negative temperature coefficient lines V1, V2, V3, V4 depending on the on-chip temperature. It is contemplated that the value of each temperature dependent voltage T1, T2, T3, T4 is determined digitally by using a voltage meter or some other voltage measuring device.

Figure 7:
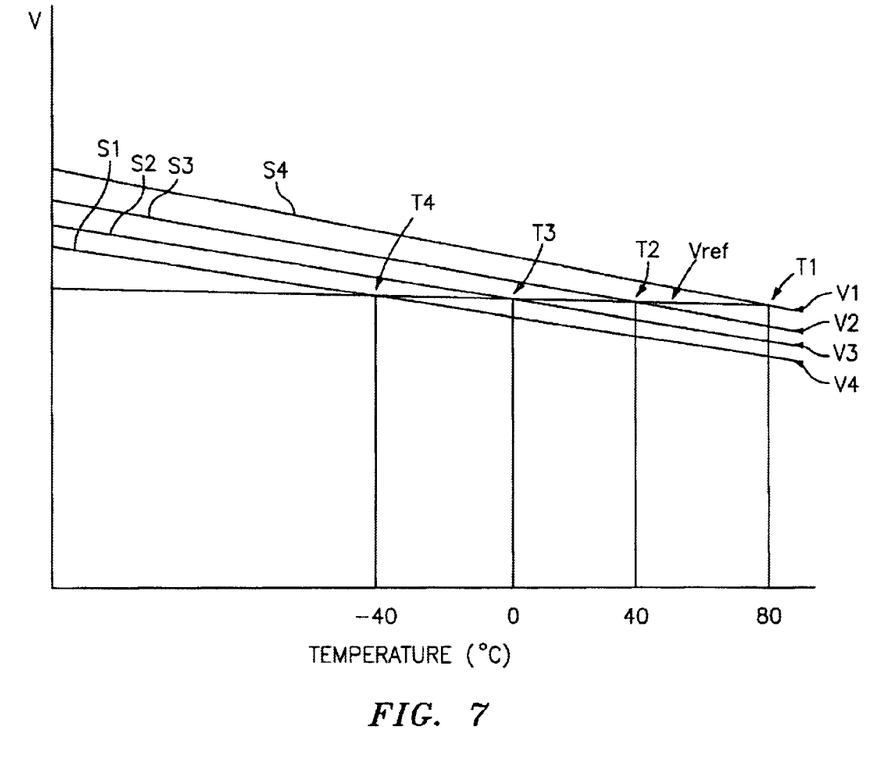
FIG. 7 is a chart illustrating voltage versus temperature for the embodiment shown by FIG. 6.

As shown by FIG. 7, by properly choosing a set of Ri values for the temperature sensor circuit 20, one can get different monitoring temperatures by intersecting the group of negative temperature coefficient lines V1, V2, V3, V4 to the band-gap reference voltage line, Vref line. As mentioned above, Vref is a temperature independent band-gap reference voltage.

For example, by choosing the ratio of R5/R4 to be 0.7 and applying the slope equation S=−2(Ri/R4) mV/C, then the negative coefficient line V1 which intersects the Vref line and corresponds to temperature dependent voltage T1 has a slope of −1.4 mV per degree Celsius (S4) and intersects the Vref line when the on-chip temperature is approximately eighty degrees Celsius as indicated by FIG. 7.

Similarly, if the R6/R4 ratio is chosen to be 0.6, then the negative coefficient line V2 which intersects the Vref line and corresponds to temperature dependent voltage T2 has a slope of −1.2 mV per degree Celsius (S3) and intersects the Vref line when the on-chip temperature is approximately forty degrees Celsius. Likewise, if the R7/R4 ratio is chosen to be 0.5, then the negative coefficient line V3 which intersects the Vref line and corresponds to temperature dependent voltage T3 has a slope of −1.0 mV per degree Celsius (S2) and intersects the Vref line when the on-chip temperature is approximately zero degrees Celsius. Still, if the R8/R4 ratio is chosen to be 0.4, then the V4 line which intersects the Vref line and corresponds to temperature dependent voltage T4 has a slope of −0.8mV per degree Celsius (S1) and intersects the Vref line when the on-chip temperature is minus forty degrees Celsius.

Accordingly, one can sense the on-chip temperature using the first embodiment of the band-gap reference and temperature sensor circuit 600 as shown by FIG. 6 by correlating the temperature dependent voltages T1, T2, T3, T4 with the chart of FIG. 7. For example, if the temperature dependent voltage T1 is determined to be 0.7 V, then it can be observed from FIG. 7 that the on-chip temperature is less than eighty degrees Celsius. This is because the negative coefficient line V1 which corresponds to the temperature dependent voltage T1 intersects the Vref line (which is equal to 0.5 V in the illustrated example) when the on-chip temperature is approximately eighty degrees Celsius, as indicated above. Therefore, when the voltage is greater than Vref (i.e., 0.5 V in the illustrated example), the on-chip temperature corresponds to a temperature reading which is to the left of the intersection point between the Vref line and the V1 line. If, on the other hand, the temperature dependent voltage T1 is determined to be less than Vref, it is determined that the on-chip temperature is greater than eighty degrees Celsius. The same process is used to determine the on-chip temperature when using the other three temperature dependent voltages T2, T3, T4.

The results obtained can be used to adjust the DRAM refresh cycle time. For example, if the temperature is high, the refresh cycle time can be shortened. Further, the results can be used to reduce the cycle frequency of the CPU chip to avoid overheating. Additionally, the results can be used to activate an on-chip or off-chip cooling device to chill the chip.

It is contemplated to input the output of differential amplifiers Diff4, Diff5, Diff6, Diff7 to a voltage measuring device having voltage measuring circuitry and a processor storing programmable instructions therein for measuring the temperature dependent voltages T1, T2, T3, T4 and correlating these voltages with data indicative of the chart shown by FIG. 7 to determine the on-chip temperature. The data can be stored within the processor, a memory of the voltage measuring device, or within a remote database accessible by the processor by a network data connection, such as an internet, local area network (LAN), wide area network (WAN), public switched telephone network (PSTN) or other data connection.

It is further contemplated that other methods can be employed using the band-gap reference and temperature sensor circuit 600 to determined the on-chip temperature. For example, it is contemplated that one can use a set of positive temperature coefficient voltage lines from the kT/q component to intersect the Vref line at different temperature points for sensing the on-chip temperature.

It is further contemplated to divide the set of negative temperature coefficient voltage lines V1, V2, V3, V4 with a resistor value to obtain a set of negative temperature coefficient current lines and to use a positive temperature current line as a reference to intersect the set of negative temperature coefficient current lines. It is further contemplated to use a negative temperature current line as a reference to intersect a set of positive voltage slope lines.

It is further contemplated that the sampling method described above with reference to FIG. 4A can be implemented to save power. That is, the band-gap reference voltage or current is left floating when the circuit is idle, i.e., during low-power operations, and quickly restored at a fixed level during high-power operations.

The temperature sensor circuit 600 is less sensitive to process variations, such as variations of device dimensions, channel doping, annealing conditions, etc., since Vref is independent of the temperature. Further, the sensor circuit 600 can operate at low-voltage, even below one volt, and is also suitable for using the sampling technique for conserving power. In the sampling mode, the chip's temperature is measured periodically in order to save power.

B. A Second Embodiment

Figure 8:
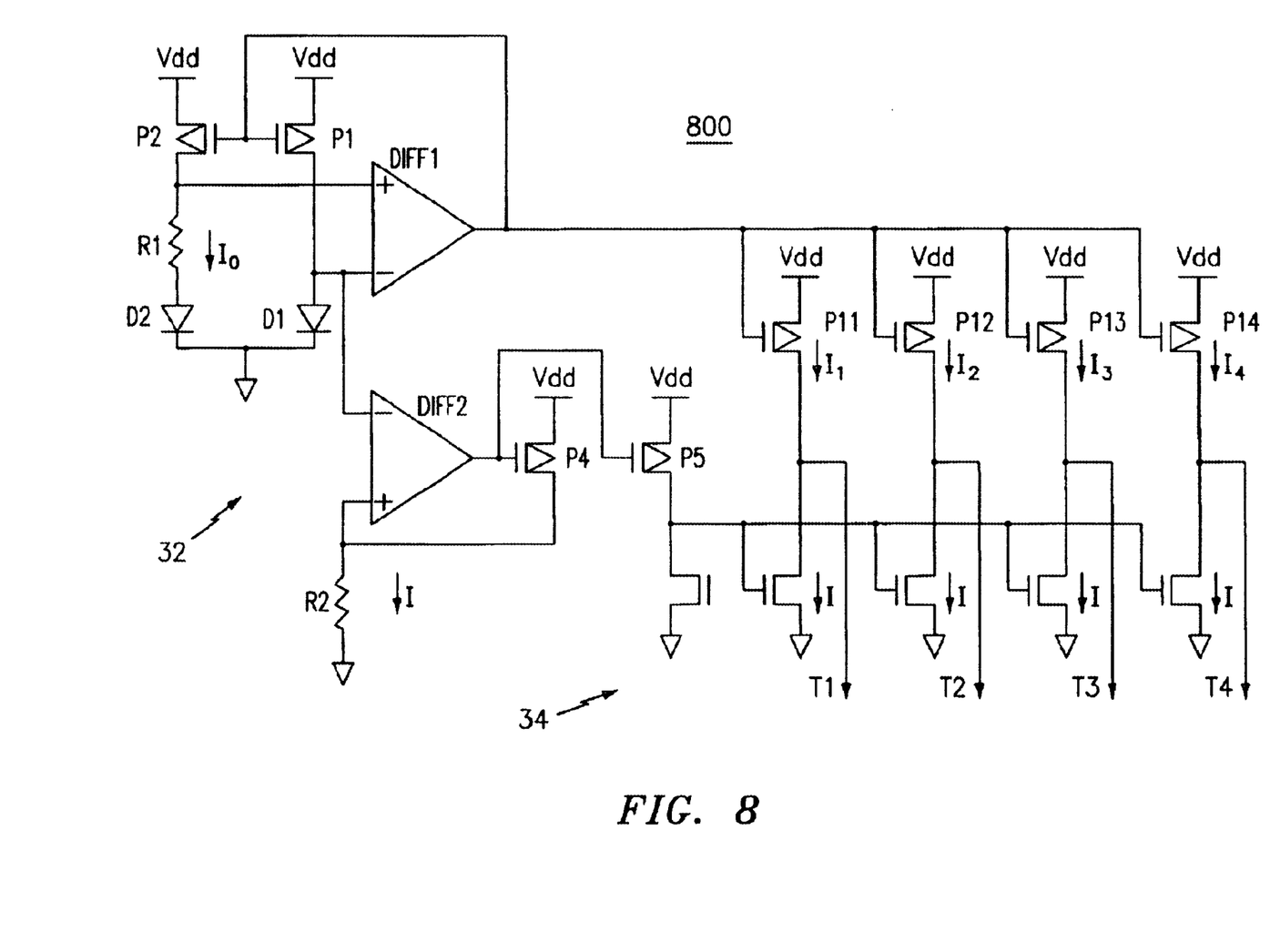
FIG. 8 is a schematic diagram of a second embodiment of a combined low-voltage, low-power band-gap reference and temperature sensor circuit according to the present invention.

A second embodiment of the band-gap reference and temperature sensor circuit of the present invention is shown by FIG. 8 and designated generally by reference numeral 800. Sensor circuit 800 includes a band-gap reference circuit 32 and a temperature sensing circuit 34. Sensor circuit 800 uses the concept of positive and negative temperature slope current components to perform temperature sensing.

The band-gap reference circuit 32 is almost identical to band-gap reference circuit 400 described above with reference to the first embodiment. It is noted that band-gap reference circuit 32 is schematically illustrated in a different configuration than band-gap reference circuit 600. Further, it is noted that the by-pass transistors BT1, BT2, the high-R resistors HR1, HR2 and the SLPN signal are not shown by FIG. 8, since FIG. 8 is illustrated as operating during normal power operations when these elements are by-passed by a low SLPN signal.

Band-gap reference circuit 32 includes two differential amplifiers Diff1, Diff2, two diodes D1, D2, two resistors R1, R2 (resistor R3 has been eliminated), transistors P1, P2, P4, P5 (transistor P3 has been eliminated). Preferably, diode D2 is approximately sixteen times larger in surface area than diode D1.

The first current component, I, from the band-gap reference circuit 32 has a negative temperature dependent or a negative slope. That is, when the temperature increases, the first current component, I, decreases. Accordingly, the first current component, I, is used as the universal reference current and has a low-current value.

Figure 9:
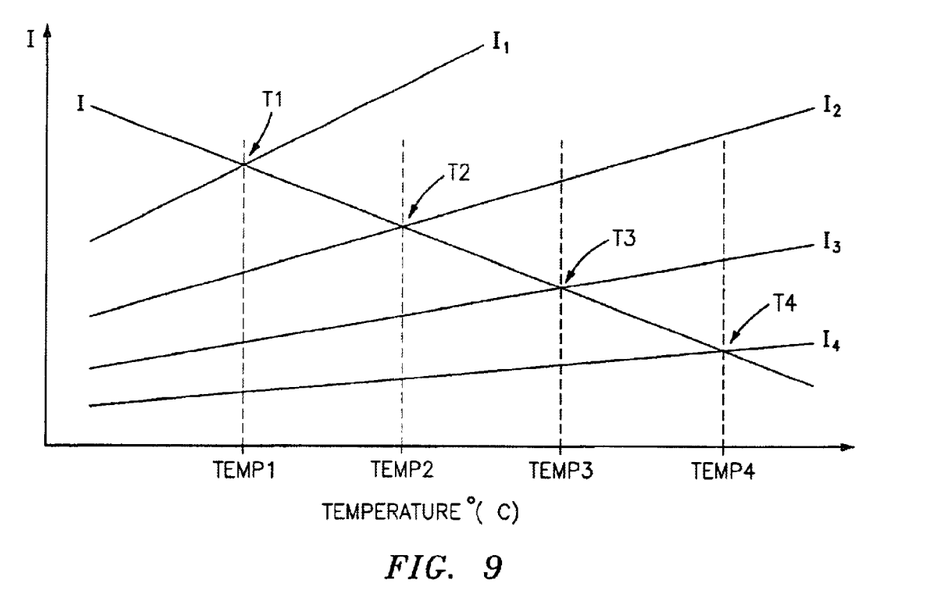
FIG. 9 is a chart illustrating current versus temperature for the embodiment shown by FIG. 8.

The second current component, Io, from the band-gap reference circuit 32 is a positive temperature dependent band-gap reference current having a constant-current value. This current is mirrored and multiplied by a ratio of about Wi/Wo, where Wi (i=11, 12, 13, 14) corresponds to the width of transistors P11, P12, P13, P14 of the temperature sensing circuit 34 and Wo is the width of transistors P1, P2, P4, P5 to form a set of positive current slope lines I1, I2, I3, I4 with different levels of offsets, as illustrated by FIG. 9. Wi is properly sized so that the desired temperature is accurately monitored.

To determine the on-chip temperature, the first current component, I, is compared with Ii, i.e., where i=11, 12, 13, 14 to designate the current flowing through transistors P11, P12, P13, P14. When Ii>I, a corresponding temperature dependent current Ti will be flagged to show the corresponding on-chip temperature as indicated by FIG. 9. For example, If the temperature dependent current T1 is flagged when the first current component, I, is compared with Ii, then the on-chip temperature is determined to be approximately equal to Temp1.

If the temperature dependent current T2 is flagged, then the on-chip temperature is determined to be approximately equal to Temp2. If the temperature dependent current T3 is flagged, then the on-chip temperature is determined to be approximately equal to Temp3. If the temperature dependent current T4 is flagged, then the on-chip temperature is determined to be approximately equal to Temp4.

It is contemplated that the drain of each transistor P11, P12, P13, P14 can be connected to a current measuring device having current measuring circuitry and a processor storing programmable instructions therein for measuring the temperature dependent currents T1, T2, T3, T4 and correlating these currents with data indicative of the chart shown by FIG. 9 to determine the on-chip temperature. The data can be stored within the processor, a memory of the voltage measuring device, or within a remote database accessible by the processor by a network data connection, such as an internet, local area network (LAN), wide area network (WAN), public switched telephone network (PSTN) or other data connection.

It is further contemplated that other methods can be employed using the band-gap reference and temperature sensor circuit 800 to determined the on-chip temperature. For example, it is contemplated to have the reference current have a positive temperature current line and intersect a set of negative current lines. It is further contemplated to multiply the set of positive current lines I1, I2, I3, I4 with a resistor value to obtain a set of positive voltage lines and to use a negative temperature voltage line as a reference to intersect the set of positive voltage lines. It is further contemplated to use a positive temperature voltage line as a reference to intersect a set of negative voltage lines.

It is further contemplated that the sampling method described above with reference to FIG. 4A can be implemented to save power. That is, the band-gap reference voltage or current is left floating when the circuit is idle, i.e., during low-power operations, and quickly restored at a fixed level during high-power operations.

The low-voltage, low-power band-gap reference and temperature sensor circuits described above can be added to most semiconductor chips to be able to obtain a temperature independent reference voltage, Vref, or temperature dependent reference current, I, to be able to sense the on-chip temperature, and to provide a binary output to the programmable table circuit 105 for adjusting the timing delay of the temperature dependent timing delay circuit 102. The sensor circuits are insensitive to supply voltage.

The sensor circuits described herein do not consume a great amount of power and operate accurately, even when the supply voltage is less than one volt. The power consumption of the sensor circuits is less than one $\mu$W, which prevents the sensor circuits from causing any local heat-up of the chip.

Additionally, the band-gap reference and temperature sensor circuits are designed for implementation within battery-operated devices having at least one memory unit. The low-power circuits extend battery lifetime.

What has been described herein is merely illustrative of the application of the principles of the present invention. For example, the functions described above and implemented as the best mode for operating the present invention are for illustration purposes only. Other arrangements and methods may be implemented by those skilled in the art without departing from the scope and spirit of this invention.

We claim:

1. A temperature programmable timing delay system comprising:

means for generating a reference parameter, wherein said means for generating said reference parameter includes a reference circuit comprising:

a first and a second diode, where said second diode is connected in series with a first resistor, a first amplifier having a positive input connected to said first resistor and a negative input connected to said first diode, said first amplifier having an output outputting a current output, said output being connected to at least a first set of transistors; and a second amplifier having a negative input connected to said first diode and a positive input connected to a second resistor, said second amplifier having an output outputting a current output, said output being connected to at least a second set of transistors;

means for sensing the on-chip temperature by utilizing at least said reference parameter; and means for providing a timing adjustment signal for adjusting a clock rate corresponding to an output of said means for sensing, the means for providing including a programmable table circuit storing clock timing as a function of temperature.

2. The timing delay system according to claim 1, wherein said reference parameter is a temperature independent band-gap reference voltage.

3. The timing delay system according to claim 1 wherein said reference parameter is a temperature dependent band-gap reference current.

4. The timing delay system according to claim 1, wherein said second diode has a cross-sectional area which is approximately sixteen times larger than the cross-sectional area of said first diode.

5. The timing delay system according to claim 1, wherein said current output of said first amplifier and said current output of said second amplifier are added and multiplied by a resistor value to obtain a band-gap reference voltage.

6. The timing delay system according to claim 1, wherein said current output of said first amplifier has a positive temperature coefficient and said current output of said second amplifier has a negative temperature coefficient.

7. The timing delay system according to claim 1, wherein said current output of said first amplifier is mirrored and multiplied by a ratio of about Wi/Wo, where Wi corresponds to the width of one of four transistors of said means for sensing said on-chip temperature and Wo corresponds to the width of said at least said first set of transistors.

8. The timing delay system according to claim 1, wherein said reference circuit further comprises a third resistor coupled to at least one of said second set of transistors.

9. The timing delay system according to claim 8, wherein said reference circuit further comprises:
a first by-pass transistor parallel to a first high-resistance resistor in series with said first resistor;
a second by-pass transistor parallel to a second high-resistance resistor in series with said second resistor;
a third by-pass transistor parallel to a third high-resistance resistor in series with said third resistor; and
means for receiving a control signal connected to said first, second and third by-pass transistors, wherein said control signal controls whether said reference circuit by-passes said first, second and third high-resistance resistors to reduce the DC current when said reference circuit is operated during low-power operations.

10. The timing delay system according to claim 8, wherein said first resistor has a resistance value of approximately 10 k-ohms, said second resistor has a resistance value of approximately 83 k-ohms, and said third resistor has a resistance value of approximately 35 k-ohms.

11. The timing delay system according to claim 9, wherein said first high-resistance resistor, said second high-resistance resistor and said third high-resistance resistor have a resistance value of approximately nine times the resistance value of said first resistor, second resistor and said third resistor, respectively.

12. The timing delay system according to claim 1, wherein said means for sensing said on-chip temperature includes a temperature sensing circuit comprising:
a third amplifier having a positive input connected to said first diode and a negative input connected to a fourth resistor, said third amplifier having an output outputting a current output, said output being connected to at least a third set of transistors;
a fifth resistor connected to a first transistor of said at least said third set of transistors;
a sixth resistor connected to a second transistor of said at least said third set of transistors;
a seventh resistor connected to a third transistor of said at least said third set of transistors;
an eight resistor connected to a fourth transistor of said at least said third set of transistors;
a set of amplifiers having a positive input connected to a corresponding one of said fifth, sixth, seventh and eighth resistors and a negative input connected to said reference parameter, each of said set of amplifiers having an output outputting a temperature dependent voltage.

13. The timing delay system according to claim 1, wherein said means for sensing said on-chip temperature includes a temperature sensing circuit comprising:
a third set of transistors having different widths connected to said output of said first amplifier and a corresponding transistor of a fourth set of transistors; and
a transistor being connected to each of said fourth set of transistors and at least one of said second set of transistors, each of said third set of transistors outputting a temperature dependent current.

14. A temperature programmable timing delay system comprising:
means for generating a reference parameter;
means for sensing the on-chip temperature by utilizing at least said reference parameter; and
means for providing a timing adjustment signal for adjusting a clock rate corresponding to an output of said means for sensing. the means for providing including a programmable table circuit storing clock timing as a function of temperature, wherein
the output of said means for sensing is a first binary output and said means for providing comprises means for converting the first binary output to a second binary output,
said means for converting the first binary output to the second binary output being a programmable table circuit, and
said programmable table circuit being selected from the group consisting of mask programmable read-only-memory, flash memory, look-up table, read-only-memory (ROM), field programmable gate array (FPGA), EEPROM, and programmable e-fuse.

15. The timing delay system according to claim 14, wherein said programmable table circuit stores the relationship of the timing delay versus the on-chip temperature.

16. The timing delay system according to claim 14, wherein said means for providing further comprises a temperature dependent timing delay circuit comprising:
an input for receiving said reference parameter and inputs for receiving a respective bit of the second binary output; and
an input for receiving a clock signal and an output for outputting said timing delay signal.

17. The timing delay system according to claim 16, wherein each of said inputs for receiving said respective bit of the second binary output includes a respective diode, and wherein each diode has a respective width different from an adjacent diode for binary weighting said received respective bit.

18. A temperature programmable timing delay system utilizing a band-gap reference and temperature sensor circuit for generating a band-gap reference and sensing the on-chip temperature of an integrated circuit chip. said timing delay system comprising:
a programmable table circuit having inputs for receiving a binary output of said band-gap reference and temperature sensor circuit and outputting a binary output corresponding to the received binary output. the programmable table circuit storing clock timing as a function of temperature; and a temperature dependent timing delay circuit having inputs for receiving said binary output of said programmable table circuit and an output for outputting a timing delay signal for delaying a clock by a timing delay corresponding to the binary output of said programmable table circuit, wherein said programmable table circuit is selected from the group consisting of mask programmable read-only-memory, flash memory, look-up table, read-only-memory (ROM), field programmable gate array (FPGA), EEPROM, and programmable e-fuse.

19. The timing delay system according to claim 18, wherein said band-gap reference is a temperature independent band-gap reference voltage having a constant-voltage value.

20. The timing delay system according to claim 18, wherein said band-gap reference is a temperature dependent band-gap reference current having a constant-current value.

21. A method for varying a characteristic of a timing delay signal in accordance with variations of the on-chip temperature of an integrated circuit chip. said method comprising:

generating a reference parameter;

sensing the on-chip temperature of said integrated circuit chip by utilizing at least said reference parameter;

providing the sensed on-chip temperature as a binary reading;

using the binary reading for providing a respective binary code indicating a timing delay using a programmable table circuit storing timing delay as a function of temperature; and varying the characteristic of the timing delay signal in accordance with the binary code, wherein said step of sensing said on-chip temperature of said integrated circuit chip by utilizing said reference parameter comprises the steps of:

plotting a current versus temperature chart, plotting a temperature dependent current slope line corresponding to a temperature dependent current slope line measured using a band-gap reference and temperature sensor circuit on said current versus temperature chart, and plotting a set of temperature dependent current slope lines on said current versus temperature chart, wherein said set of temperature dependent current slope lines correspond to temperature dependent current slope lines measured using said band-gap reference and temperature sensor circuit, wherein the on-chip temperature of said integrated circuit chip is approximately equal to the temperature corresponding to a point where at least one of said set of temperature dependent current slope lines approximately intersects said temperature dependent current slope line.

22. The method according to claim 21, wherein said step of generating said reference parameter comprises the steps of:

generating a first current having a negative temperature coefficient and a second current having a positive temperature coefficient; and summing portion of said first and second currents and multiplying the sum with a resistance value.

23. The method according to claim 21, wherein said step of sensing said on-chip temperature of said integrated circuit chip by utilizing said reference parameter comprises the steps of:

plotting a voltage versus temperature chart;

plotting a voltage value corresponding to said reference parameter on said voltage versus temperature chart; and plotting a set of temperature dependent voltage slope lines on said voltage versus temperature chart, wherein said set of temperature dependent voltage slope lines correspond to temperature dependent voltage slope lines measured using a band-gap reference and temperature sensor circuit, wherein the on-chip temperature of said integrated circuit chip is approximately equal to the temperature corresponding to a point where at least one of said set of temperature dependent voltage slope lines approximately intersects said voltage value corresponding to said reference parameter.

24. The method according to claim 21, wherein said reference parameter is a temperature independent band-gap reference voltage having a constant-voltage value.

25. The method according to claim 21, wherein said step of using the binary reading for providing a respective binary code indicating a timing delay comprises the step of inputting the binary reading to a programmable table circuit and outputting the respective binary code, wherein the programmable table circuit stores the relationship of the timing delay versus the on-chip temperature.

26. The method according to claim 25, wherein said programmable table circuit is selected from the group consisting of mask programmable read-only-memory, flash memory, look-up table, read-only-memory (ROM), field programmable gate array (FPGA), EEPROM, and programmable e-fuse.

* * * * *